United States Patent [19]

Clark

[11] 4,358,749

[45] Nov. 9, 1982

[54] OBJECT DETECTION

[75] Inventor: Michael A. G. Clark, North Baddesley, England

[73] Assignee: Redland Automation Limited, Winchester, England

[21] Appl. No.: 203,078

[22] Filed: Oct. 31, 1980

[30] Foreign Application Priority Data

Nov. 21, 1979 [GB] United Kingdom ............... 7940182

[51] Int. Cl.³ ....................... G08B 13/26; G08G 1/01
[52] U.S. Cl. .................................. 340/38 L; 340/568
[58] Field of Search ................. 340/38 L, 568, 561; 364/436, 424

[56] References Cited

U.S. PATENT DOCUMENTS

| | | | |
|---|---|---|---|
| 3,178,685 | 4/1965 | Pettitt | 340/38 L |
| 3,346,856 | 10/1967 | Doble et al. | 340/38 L |
| 3,373,374 | 3/1968 | Marosi | 331/8 |
| 3,397,364 | 8/1968 | Crandall | 331/65 |
| 3,587,040 | 6/1971 | Fathauer | 340/38 L |
| 3,685,013 | 8/1972 | Brickner | 340/38 L |
| 3,863,206 | 1/1975 | Rabie | 340/38 L |
| 3,868,626 | 2/1975 | Masher | 340/38 L |
| 3,875,525 | 4/1975 | Ballinger et al. | 340/38 L |
| 3,875,555 | 4/1975 | Potter | 340/38 L |
| 3,943,339 | 3/1976 | Koerner et al. | 390/38 L |
| 4,023,017 | 5/1977 | Ceseri | 340/38 R |

Primary Examiner—Glen R. Swann, III

Attorney, Agent, or Firm—Sughrue, Mion, Zinn, Macpeak and Seas

[57] ABSTRACT

In a vehicle detector installation employing an inductive sensing loop that is a frequency determining element of an oscillator, the oscillator is provided with a voltage controlled capacitor as another frequency determining element and is made the voltage controlled oscillator (VCO) of a phase locked loop whereby the VCO is locked to a reference frequency. The presence of a vehicle in the vicinity of the loop causes the capacitor voltage to vary to maintain lock. The varying voltage is applied to an auxiliary VCO whose frequency is accordingly varied and may be analyzed for vehicle detection purposes. The oscillator containing the sensing loop is thereby prevented from influencing nearby installations by the FM sidebands that would be produced in the absence of the frequency locking. A group of such installations may use a common reference frequency source with each installation operating at its own locked frequency by virtue of means providing a programmable frequency division ratio from the source. Microcomputer control of the operation of the installations is disclosed using the clock source of the microcomputer as the reference frequency source. Each installation is provided with a counter for sampling its auxiliary oscillator frequency and the microcomputer is connected over a bus system to poll the counters, all vehicle detection analysis being performed by the microcomputer.

17 Claims, 2 Drawing Figures

OBJECT DETECTION

FIELD OF THE INVENTION

This invention relates to an object detection installation and to a system comprising a plurality of such installations and to object detection apparatus for use in such an installation. The invention finds particular application to the presence detection of vehicles.

BACKGROUND TO THE INVENTION

As is well known the presence of vehicles is commonly detected by the influence they exert on the inductance of an a.c. energised loop laid in the road or other place where presence detection is required. The presence of a vehicle lowers the loop inductance. It is well established practice to monitor loop inductance changes by making the loop a frequency determining element of an oscillator circuit, for example by connecting it in circuit with capacitance to provide a resonant circuit for the oscillator so that the movement of a vehicle over the loop induces a frequency modulation (F.M.) of the oscillator. Changes in oscillator frequency are analyzed (for which many forms of detector circuitry are known) to indicate a vehicle presence. In certain circumstances problems can arise with these established techniques.

Two detector loops may be located in proximity and if the loops have similar inductances their operating frequencies may be sufficiently close to cause crosstalk due to coupling between the loops. This problem is compounded because as a vehicle moves over the loop the resultant F.M. sidebands can extend over a wide bandwidth.

In some countries the licencing authority will only allow operation within a specific frequency band making it more difficult to ensure that adjacent loop installations are sufficiently spaced in operating frequency. Additionally limits may be placed on frequency stability which are difficult to meet with free-running oscillators inherently subject to ambient changes.

There will be described hereinafter how the present invention can be put into practice to provide a detector loop installation in which the detector loop is operated at constant frequency yet a frequency output is obtained that varies with the loop inductance. Furthermore, it will be shown how a number of detector loops can operate under such constant frequency conditions, the operating frequency of each loop being independently selectable even when the loops have similar inductances.

SUMMARY OF THE INVENTION

According to one aspect of the present invention there is provided an object detection installation comprising:

a main oscillator circuit having a resonant circuit for determining the oscillator output frequency, the frequency determining elements of the resonant circuit including an object detection inductance sensitive to the presence of an object in the vicinity thereof and a voltage-controlled capacitance;

a source of a reference frequency signal;

a phase-sensitive detector arrangement having respective inputs connected to receive the main oscillator frequency output and reference frequency signal and having its output connected to said voltage-controlled capacitance to supply a control voltage thereto whereby the main oscillator output frequency is locked to that of the reference frequency signal;

an auxiliary, voltage-controlled oscillator connected to the output of the phase-sensitive detector arrangement to be responsive thereto and provide an output signal whose frequency changes in dependence on changes in said object detection inductance; and means for processing said auxiliary output signal to provide an object detection signal.

In operating a system of such installations, it is possible to use a common basic frequency source to clock from which each installation derives its own operating frequency. Furthermore, the signal processing can be performed by a common processor to which the individual frequency information from each installation is provided.

In a second aspect the invention provides an object detection system comprising:

(A) a plurality of object detection installations each comprising:

(1) a main oscillator circuit having a resonant circuit for determining the oscillator output frequency, the frequency determining elements of the resonant circuit including an object detection inductance sensitive to the presence of an object in the vicinity thereof and a voltage-controlled capacitance;

(2) means for deriving from an input signal a signal at a reference frequency;

(3) a phase-sensitive detector arrangement having respective inputs connected to receive the main oscillator frequency output and the reference frequency signal and having its output connected to said voltage controlled capacitance to supply a control voltage thereto whereby the main oscillator output frequency is locked to that of the reference frequency signal;

(4) an auxiliary, voltage-controlled oscillator connected to the output of the phase-sensitive detector arrangement to be responsive thereto and provide an output signal whose frequency changes in dependence on changes in said object detection inductance;

(B) a source of a clock signal connected to all said reference frequency means as a common input signal therefor; and (C) processing means coupled to all said installations and selectively responsive to said auxiliary output signals to provide an object detection signal in response to a predetermined frequency change in any auxiliary output signal.

The reference frequency means of each installation is preferably adjustable to divide the frequency of the input signal by a selected factor (N). To this end the adjustable divider means may be electrically programmable, e.g. by a digital signal, and programming signals may be obtained from the processing means which is coupled to all the adjustable divider means. This coupling may be made in parallel over a common data bus. The processing means is then coupled to each installation to individually enable the programmable divider to receive programming data therefor.

Preferably each of the installations further comprises means for providing a measurement of the frequency or period of the auxiliary oscillator in digital form for supply to the processing means. This measurement means may comprise a counter coupled to the auxiliary oscillator to count the oscillator cycles and activated for a preselected period to provide the count value as the digital form of the frequency or period of the signal.

The processing means may be coupled to the counter in each installation to control the activation of same, and more particularly the processing means may supply an activation signal for said preselected period for all the counters.

The processing means may be coupled to all the installations to receive the digital form frequency signals, as parallel data, over a common data bus, the processing means being coupled to each installation to individually enable the transmission therefrom of the digital form frequency data to the processing means.

Mention has been made of the use of a common data bus for sending programming data from the processing means and frequency data to the processing means. The common data bus in each case may be constituted by a single data bus used for bidirectional data transmission between the processing means and the installations. The other coupling of the processing means to the installations comprises control lines for selecting an installation to receive or transmit data and also to select the function to be performed within the selected installation, e.g. with the aid of logic circuitry in each installation responsive to the logic levels on one or more control lines.

All the foregoing functions of the processing means may be carried out by a microprocessor or microcomputer device, the single data bus beind connected to a bidirectional port of the device. The basic frequency source can then conveniently be the clock source of the device which is usually crystal-controlled.

In yet another aspect of the invention there is provided an object detection apparatus for use in the object detection system broadly defined above, the apparatus comprising:

a main oscillator circuit of the type having its oscillation frequency determined by a resonant circuit, said oscillator circuit being connectable to an object-sensitive inductance to provide an inductive element in the resonant circuit, and including a voltage-controlled capacitance providing a capacitive element in the resonant circuit;

means for deriving from an applied input signal a signal at a reference frequency; and an auxiliary voltage-controlled oscillator circuit connected with said voltage-controlled capacitance to receive a common control voltage to simultaneously adjust the oscillation frequency of both oscillator circuits.

The invention and its practice will be further described with reference to the accompanying drawings.

DESCRIPTION OF THE PREFERRED EMBODIMENT

Figure 1:
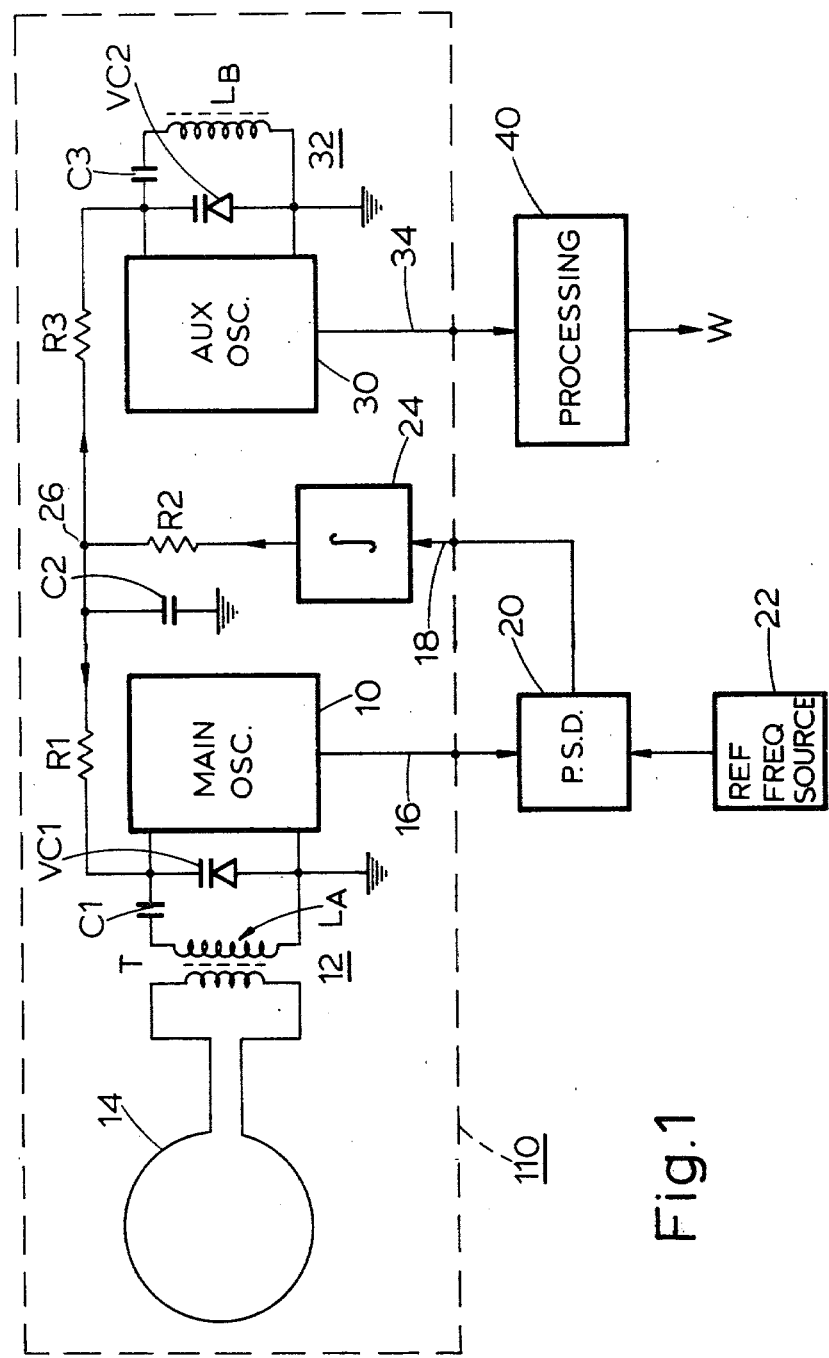
FIG. 1 shows a single vehicle detector loop installation in accord with the invention in block diagram form.

In FIG. 1 there is shown a main oscillator circuit 10. The precise constructional details are not relevant to an understanding of the present invention except that it is of the type using a resonant circuit 12 to determine the oscillation frequency, e.g. a Hartley or Colpitts oscillator. The resonant circuit is represented for explanatory purposes by an inductance $L_A$ in parallel with a voltage-controlled capacitor VC1 comprising a variable capacitance diode. A capacitor C1 serves to provide d.c. isolation. The inductance $L_A$ is that of a vehicle detector loop 14 laid in the roadway or elsewhere as transformed by a coupling transformer T. The oscillation frequency as determined by inductance $L_A$ resonated by capacitor VC1 can be tuned by applying a reverse bias voltage to the diode VC1 through a.c. isolating resistor R1. The output of the oscillator on line 16 is applied to one input of a phase-sensitive detector (PSD) 20 whose other input is supplied with a reference frequency signal from a source 22. The source is of high frequency stability, such as to a crystal-controlled oscillator, or is derived from such an oscillator. The output of PSD 20 is taken to a loop filter 24, which is preferably an integrator whose d.c. output is applied as a control voltage to the diode VC1 via RC smoothing circuit R2,C2 and isolating resistor R1. The control loop thus established is a phase-locked loop (PLL) serving to lock the tuned frequency of oscillator 10 to that of the reference source. The PLL should have a fast response referred to the passage of vehicles over the loop 14 so that there is little frequency or phase deviation in the oscillaor frequency. This assists in reducing the production of F.M. sidebands that might interfere with a nearby installation on a frequency close to that of the source 22 and whose detector loop couples with loop 14.

In operation, as the inductance of loop 14 decreases in the presence of a vehicle the capacitance of diode VC1 has to be increased to maintain the tuned frequency constant and the change of inductance is thus reflected as a change in the smoothed control voltage at point 26.

The control voltage at point 26 is converted back to a frequency signal by means of a second or auxiliary voltage-controlled oscillator 30, that is conveniently of the same type as oscillator 10, and having its frequency-determining resonant circuit 32 represented by the parallel combination of a fixed inductor $L_B$ tuned by a variable capacitance diode VC2, with a d.c. blocking capacitor C3. The control voltage is applied as a reverse bias voltage to diode VC2 via isolating resistor R3. The output of the auxiliary oscillator 30 is applied via line 34 to a processing circuit 40 responsive to a frequency change in accord with prescribed criteria to provide a vehicle presence signal W.

The arrival of a vehicle at loop 14 acts to reduce the loop inductance and increase the frequency of oscillator 10. This is counteracted by the control voltage in the PLL reducing so as to increase the capacitance of diode VC1 and correspondingly that of diode VC2. Consequently the frequency of oscillator 30 decreases with presence of a vehicle.

If the conventional increase of frequency with vehicle presence is desired this can be done at some increase in circuitry by inverting the sense of change of the control voltage applied to diode VC2. The processing circuit 40 will not be described in detail here. Many forms of such circuit are well known in the art, both analogue and digital.

Assuming the PLL controlling oscillator 10 has a fast response, the oscillator 30 will produce a frequency modulation response similar to that that would be produced by oscillator 10 in the absence of the PLL control. However, the oscillator 30 and particularly its resonant circuit and output can be sufficiently screened that the attendant FM sidebands produce no interference with nearby installations.

It is preferred to have the oscillator 30 not only of the same type as oscillator 10 but with similar parameters, except that the oscillator 30 is preferred to operate in a frequency range above the reference frequency. The two variable capacitance diodes are conveniently a pair in a single package having matched characteristics whereby they exhibit substantially equal capacitance in response to the common control voltage applied thereto. They are also preferably thermally coupled to be at the same temperature for which purpose a single package is convenient. For practical operating frequencies at say some tens of kiloHertz and to accommodate the wide range of inductances exhibited by detector loops, it is preferred to use the high capacitance variable capacitance diode packages now available providing a capacitance (per diode) of up to 500 pF and a capacitance swing of 15:1 or better. An example is the Toko type KV 1211.

The sensitivity of the described two-oscillator circuit expressed as the frequency change of oscillator 30—$\Delta f$— for a change of inductance $L_A$—$\Delta L_A$— is given by $$\frac{\Delta f}{\Delta L_A} = \frac{f_r}{2\sqrt{L_A \cdot L_B}}$$

where $f_r$ = the reference frequency.

The sensitivity is thus inversely proportional to the square-root of the detector loop inductance.

The principle of fixed frequency operation described with reference to FIG. 1 can be extended to multiple loop installations in a particularly convenient way. For example, the reference frequency source may comprise a programmable frequency divider fed from a remote crystal-controlled source. Thus a number of installations of the kind shown in FIG. 1 can be frequency controlled from a common stable source but each operate on a different frequency by adjustment of its own frequency divider. Furthermore the frequency programming can also be controlled remotely if desired.

In addition instead of having a separate processing circuit for each installation a single processing circuit can monitor the condition of each installation in turn. To this end it is preferred to divide the processing into two parts, a first of which is local at each installation and comprises frequency or period measurement of the oscillator 30, and the second part of which is common to all and can be carried out remotely, by polling (selecting) each local frequency or period measurement in turn and analyzing successive measurements pertaining to each installation to determine whether a vehicle is present at the detector loop of that installation. Since the frequency or period measurement can be performed with the aid of a digital counter, the resulting digital output can be readily transmitted for remote analysis.

Both the remote programming and analysis can be done with the aid of a microprocessor or a microcomputer as is now available. The microcomputer's crystal-controlled clock is available as the basic reference frequency. A system of detector loop installations organized in this manner will now be described with reference to FIG. 2.

Figure 2:
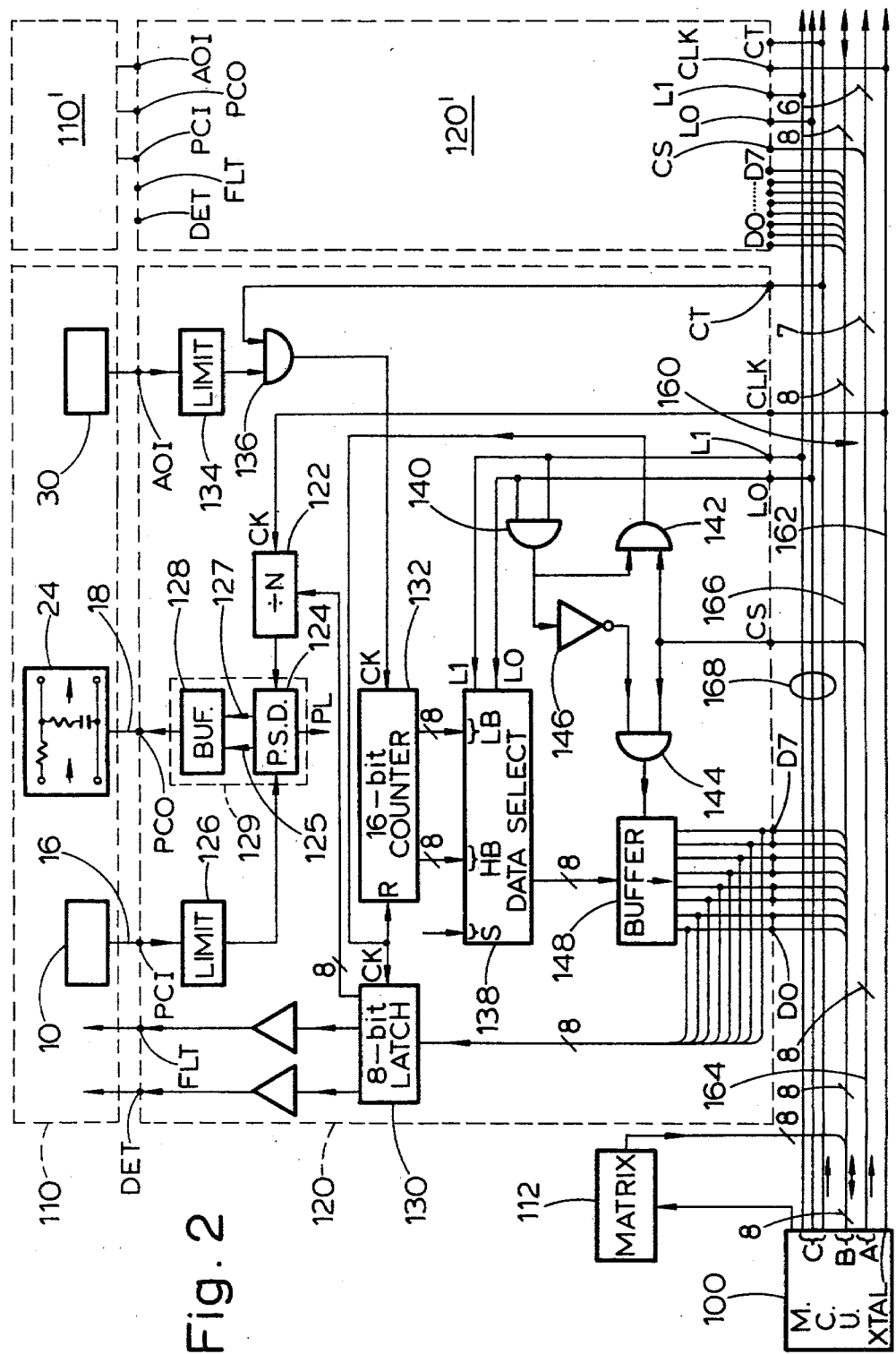
FIG. 2 shows a multiple detector loop system adapted for control by a microcomputer.

In the system of FIG. 2 a microcomputer (MCU) 100, e.g. a Motorola 6805 device, is arranged to control and accept data from a plurality of detector loop installations of which two are shown as 100, 110'. Each installation is associated with a respective digital data interface unit 120, 120' respectively. The installations 110, 110' are identical and each constitutes the portion of the installation of FIG. 1 enclosed by dashed line 110. The interface units 120, 120' are also identical and each includes a part of the installation of FIG. 1 outside the portion 110, namely the phase-sensitive detector, a programmable divider providing the local reference frequency source 22 and a digital counter providing an initial stage of processing of the output of auxiliary oscillator 30 by digitisation of the frequency. The microcomputer (MCU) connects with the digital interface units via a bus system 160. For the purpose of the system each installation 110 and its associated interface unit 120 provides one complete installation coupled to the bus system through the interface unit. As will become clear the system is extendable to more than two installations 110/120.

The 6805 MCU device provides three ports A, B and C of 8,8 and 4 bits respectively. The ports are bidirectional but only port B uses this facility providing data transfer in both directions; port A is used as an output port only for control signals and as will be described port C provides three control output terminals and one word-generating terminal. The MCU provides a further output XTAL which has its crystal-controlled clock running at a frequency in the range of 4–5 MHz say.

In order to explain operation of the system only one interface unit 120 is shown in detail, the or each other unit 120' being of like construction. Looking at the bus system 160, the clock signal XTAL from MCU 100 is supplied over line 162 to all the interface units at a respective input CLK. In order that the MCU 100 can select a given installation for polling, each interface unit has an input CS. These inputs are connected over respective ones of bus lines 164 to respective ones of the outputs of port A. Thus in the arrangement shown up to 8 interface units may be controlled. The system could be extended further by using two or more bits from port A to control the interface unit selection with the introduction of appropriate decoders.

Each interface unit has an 8 bit data port comprising terminals $D_0$–$D_7$. All the data ports are connected in parallel to the data port B of the MCU by bus line 166. The data input to the MCU port B comprises frequency data and data relating to particular conditions pertaining to individual installations; the data output comprises data for setting the programmable dividers within the interface units; and detect and fault signals arising out of the frequency data processing in the MCU and which are returned to the pertinent loop installation for local signalling or indication.

Each interface unit 120 also has three further control inputs, CT (count command), which controls the making of a frequency measurement, and logic inputs $L_0$ and $L_1$ for selecting functions within the interface units as will become clear hereinafter. These control inputs of the interface units are respectively connected in parallel by bus lines 168 to three respective bits of the MCU port C. The fourth bit of port C is used as an input in conjunction with port B for generating data signals regarding the operating frequencies of the installations 110 with the aid of a switch-settable matrix 112. This is described more fully below.

Turning now to the interface unit 120 shown in detail, the clock input CLK is fed to the clock input CK of a programmable divider 122 which supplies a selected reference frequency signal to one input of a phase comparator 124. The other input of comparator 124 is connected to receive the output of the main oscillator 10 in the loop installation 110 (FIG. 1) supplied over line 16.

This line is connected to an input of the interface denoted PCI in a FIG. 1 and is first clipped by limiter 126 before being applied to the phase comparator. The latter provides separate, mutually exclusive, high and low level outputs 125 and 127 respectively to a three-state buffer output stage 128 (also known under the trade name Tri-State) which combines the comparator output to provide either a high or low level output at terminal PCO to the integrator 24 in the associated loop installation 110 via line 18.

The comparator 124 and buffer 128 may be realised in a single device-indicated by dash line 129—such as the Motorola 14046B CMOS phase-locked loop device (or equivalent CD4046 devices from other manufacturers) or by circuitry giving the equivalent performance as specified in the Motorola data sheet on the device (see "EUROPEAN CMOS DATA BOOK" published by Motorola Inc., 1979). The inputs of PSD 124 are the PCA and PCB inputs of the 14046B device, the buffer output is that called "Phase Comparator 2(PC2)" operating in accordance with the Phase Comparator 2 state diagram and waveforms given in the data sheet. The device also provides a phase-lock indicator ouput (PCP out) indicated as output PL in the present circuit. The commercial device mentioned includes voltage-controlled oscillator which is not used in the illustrated embodiment. Hence it may be preferred to provide separate circuitry providing equivalent "Phase Comparator 2" operation.

The output of buffer 128 provides pulses at high or low level depending on the input phase relationship at comparator 124. These pulses are intended for use in an integrating type of PLL and thus may be applied to the integrator 24 of associated installation 110. The integrator may be a simple RC type of integrator which has the configuration shown in block 24 of FIG. 2 and whose parameters are given in the data sheet above-mentioned. In the present instance, the integrator 24 is working into the very high resistance inputs of the VCO circuits to installation 110 and is thus capable of providing a true integration in these circumstances.

Other forms of phase comparator/integrator combinations are, of course, usable as is known in the PLL art.

The programmable divider 122 has a 6-bit control input which is conneccted to six of the outputs of an 8-bit D-type latch 130 whose control is discussed further below. The divider 122 provides a divisor N which may need to exceed the 6-bit value transmitted to it. The six bits of data if taken alone could represent a division factor of up to 63. The actual divisor required is dependent on the input clock frequency, which is in the range 4–5 MHz in this example, and the required operating frequency range of the detector loops, typically 60–70 KHz. Thus a division factor N in the range of about 60 to 70 is required. The way this is achieved is as follows. Prior to sending data to a selected latch 130 in an interface unit, the microcomputer performs a computing opertion (all interface CS inputs inhibited) using matrix 112 to generate a base number B. For example matrix 112 may comprise eight manually-settable switches connected in common at one pole to the word-generating output terminal of port C, their other poles being respectively connected to the terminals of port B. By setting the port C terminal to level 1 an eight-bit word is generated as an input of Port B that depends on the states of the switches. Five of the bits in the generated word represent the base number B. The other three bits may be used for selecting timing within the MCU 100 and are not relevant to this discussion. The MCU then adds to the base number B, a further number x pertaining to the particular interface unit 120, 120' and so on which is next to be enabled to receive programming data, e.g. x=0 to 8 for the eight installations controllable by the system shown. The 6-bit divider factor data to the latch 130 when the interface unit 120 is enabled on input CS thus represents the number (B+x) specific to that installation.

To achieve the range of divider factor N required for the frequencies specified above, the programmable divider 122 adds a fixed number M (the same for all installations) to the number represented by the 6-bits from latch 130. This fixed number is say "32" for the parameters quoted. Thus the divider factor N of the programmable divider 122 is given by $$N=B+M+x.$$

The frequency spacing of the installations can be controlled by the selection of the values of x, the operating range is shiftable as a whole by the setting of B. It will be appreciated that the arrangement described is by way of example and particular requirements will depend upon the frequency ratios involved and upon how many bits the designer is prepared to allocate to the divider factor data.

The interface unit 120 also includes a 16-bit ripple counter 132 whose clock input CK is fed from a terminal AOI that is connected to the output line 34 of auxiliary oscillator 30 in installation 110. The oscillator output signal passes through a limiter 134 and a two-input AND-gate 136 which controls the application of the clock signal at terminal AOI to the counter. To this end the other input of AND-gate 136 is connected to the CT (count command) input of the interface unit. Thus by the MCU 100 enabling the CT input for a selected period the count reached in the counter 132 is a measure of the auxiliary oscillator frequency. The count value (16 bits) has to be transferred out of the interface unit onto the bi-directional 8-bits bus 166 and is thus divided into two 8-bit bytes, high byte and low byte respectively, with the aid of data selector 138 whose 8-bit output is connected to output terminals $D_0$–$D_7$ through a three-level buffer 150. It is also necessary to transfer data into the 8-bit latch 130 whose inputs are also connected to respective ones of terminals $D_0$–$D_7$. To transfer data along bus 166 in an orderly and proper fashion a sequence control is required and this is done with the aid of the three control lines of port C of MCU 100 connected to the inputs CS, $L_0$ and $L_1$ of each interface unit.

The selection of the particular interface unit 120 requires its input CS to be selected by setting it to level 1. The required function within the selected unit is controlled by logic inputs $L_0$, $L_1$—except for count which is controlled separately. To enter data into the latch 130, the inputs $L_0$ and $L_1$ are both set to 1 enabling AND-gate 140 whose output together with the CS signal enables AND-gate 142 to clock latch 130 and reset counter 132 at terminal R. The 1.1 logic input levels inhibit data selector 138. The 6-bit data for the programmable divider has been made available at data terminals $D_0$–$D_5$ say. Since the latch 130 is clocked with every counter reset, the divider factor data has to be repeated at every reset operation notwithstanding no change is wanted in the divider ratio N.

The other two inputs of the latch 130 connected to terminals $D_6$ and $D_7$ are allotted to receive fault and detect signals from the MCU 100. The latched signals appear at terminals FLT and DET respectively of the interface unit and may be sent on to the associated installation 110 for use as required. A detect signal will be generated in dependence upon the frequency measurements—at least two—previously reported from counter 16 and processed in the MCU 100.

By successively activating the CS terminals of the interface units 120, the counter of each can be reset and the latch data entered. At this time the CT inputs of all interface units are simultaneously enabled (all CS inputs now being low) for a selected period controlled by the MCU clock so that each counter makes a measure of the frequency of its associated auxiliary oscillator. The count values have then to be read out by successively polling the interface units 120, 120' and so on. The illustrated interface unit 120 is polled by enabling its CS input and by applying in succession 0 and 0 and then 0 and 1 to the logic inputs $L_0$ and $L_1$. The 0, 0 designation applied to data selector 138 causes the low 8-bit byte of the counter applied to its input LB to be transferred to its output and thence to the data terminals $D_0$–$D_7$ through the three-level buffer 148. The enable input of the buffer is controlled by the CS and $L_0$, $L_1$ signals. The buffer is enabled by the output of an AND-gate 144 having one input connected to input CS and the other to the output of gate 140 via inverter 146. These logic connections provide mutually exclusive data input and data output conditions on terminals $D_0$–$D_7$. All operations require CS to be level 1 but the latch and counter reset are only activated when $L_0$, $L_1$ are 1,1 which state inhibits the buffer. Any 0 level of $L_0$ or $L_1$ inhibits the latch clock input and counter reset but enables the buffer for output.

Consequently, the 0,0 on $L_0$, $L_1$ causes the low byte to be placed on terminals $D_0$–$D_7$ and sent to MCU 100. Putting 0,1 on $L_0$, $L_1$ causes the high byte applied to the input HB of data selector 148 to be transferred to the data terminals via buffer 148. Once the MCU 100 has acquired the frequency data from all the interface units a fresh reset cycle can be initiated. However, a further output facility is provided in the apparatus illustrated.

Different local installations may require to operate in different modes and at different sensitivities. These local conditions can be entered from respective selector switches (not shown) associated with each interface unit at a third set of input terminals S of the data selector together with other information such as the phase lock acquired signal PL from the phase comparator 124. The mode and sensitivity information is relevant to the microcomputer in determining the criteria by which a vehicle presence is to be decided in analyzing successive frequency data from a given installation by the microcomputer. This additional data at input S of data selector 148 is read out from an interface unit by 1 and 0 respectively on $L_0$ and $L_1$, as well as setting the CS input at level 1.

It is not considered necessary to describe in detail the processing of the data undertaken by the MCU. The basic techniques of comparing successive frequency measurements to ascertain a detect condition and allow for ambient drift are well known and those skilled in microcomputer programming can translate these techniques into appropriate programs. It is also believed that the operational sequences have been described sufficiently to enable those skilled in the art to compile appropriate control programs. It may be noted that while the CT inputs of all the interface units are simultaneously enabled to provide a fresh set of frequency data at all the installations, the microcomputer 100 is performing the necessary comparisons and calculations based on the previously acquired frequency data to determine whether any detect signals should be issued. If so, after acquiring the fresh data, i.e. the low and high byte operations, the detect signals, if any, are supplied to the latches 130 of appropriate installations at the next latch clock/count reset operation. The latches then hold these signals for the remainder of the operational cycle. The cycle with modern microcomputer devices can be done so quickly that results are virtually instantaneous. For example, the complete cycle time to handle eight installations may be made around ten milliseconds of which the simultaneous count period of say 10 mS greatly exceeds the total time—typically 128µS—for data transfers. The computations done by the microprocessor can be readily made in parallel in the count time.

The interface units may be realised in discrete or monolithic circuitry preferably based on CMOS technology. The phase comparator has already been discussed. In using discrete devices the programmable divider 122 may be realised from individual gates and latches, and the counter 132 use, for example, cascaded 4040 and 4024 type devices. The data selector 138 and buffer 148 may be combined by the use of four 40097 type devices. These are 6-bit devices in 4+2-bit sections and therefore groupable to provide three 8-bit blocks having three-state outputs. A suitable device for the 8-bit latch 130 is a type 4508. Each of the limiters may be realised by a pair of series-connected inverters.

What is claimed is:

1. An object detection installation comprising:
    a main oscillator circuit having a resonant circuit for determining the oscillator output frequency, the frequency determining elements of the resonant circuit including an object detection inductance sensitive to the presence of an object in the vicinity thereof and a voltage-controlled capacitance;
    a source of a reference frequency signal;
    a phase-sensitive detector arrangement having respective inputs connected to receive the main oscillator frequency output and reference frequency signal and having its output connected to said voltage-controlled capacitance to supply a control voltage thereto whereby the main oscillator output frequency is locked to that of the reference frequency signal;
    an auxiliary, voltage-controlled oscillator connected to the output of the phase-sensitive detector arrangement to be responsive thereto and provide an output signal whose frequency changes in dependence on changes in said object detection inductance; and
    means for processing said auxiliary output signal to provide an object detection signal.

2. An object detector installation as claimed in claim 1 in which said auxiliary voltage-controlled oscillator comprises an oscillation frequency-determining resonant circuit including a fixed inductance and a voltage controlled capacitor connected to the output of the phase-sensitive detector arrangement to receive the control voltage therefrom.

3. An object detector installation as claimed in claim 2 in which said voltage-controlled capacitors of the main and auxiliary oscillators are thermally coupled to be at substantially the same temperature.

4. An object detection system comprising:
(A) a plurality of object detection installations each comprising:
   (1) a main oscillator circuit having a resonant circuit for determining the oscillator output frequency, the frequency determining elements of the resonant circuit including an object detection inductance sensitive to the presence of an object in the vicinity thereof and a voltage-controlled capacitance;
   (2) means for deriving from an input signal a signal at a reference frequency;
   (3) a phase-sensitive detector arrangement having respective inputs connected to receive the main oscillator frequency output and the reference frequency signal and having its output connected to said voltage-controlled capacitance to supply a control voltage thereto whereby the main oscillator output frequency is locked to that of the reference frequency signal;
   (4) an auxiliary, voltage-controlled oscillator connected to the output of the phase-sensitive detector arrangement to be responsive thereto and provide an output signal whose frequency changes in dependence on changes in said object detection inductance;
(B) a source of a clock signal connected to all said reference frequency means as a common input signal therefor; and
(C) processing means coupled to all said installations and selectively responsive to said auxiliary output signals to provide an object detection signal in response to a predetermined frequency change in any auxiliary output signal.

5. An object detection system as claimed in claim 4 in which the reference frequency means of each installation is adjustable to divide the frequency of the input signal by a selected factor.

6. An object detection system as claimed in claim 5 in which said adjustable divider means is electrically programmable to set said selected factor, and said processing means is coupled to all said adjustable divider means to supply respective programming signals thereto.

7. An object detection system as claimed in claim 6 in which said processing means is coupled in parallel to all said adjustable divider means over a common data bus and is coupled to each installation to individually enable the adjustable programmable divider of that installation to receive programming data.

8. An object detection system as claimed in claim 4 in which each of said installations further comprises means for providing a measurement of the frequency or period of said auxiliary oscillator in digital form for supply to said processing means.

9. An object detector system as claimed in claim 8 in which said measurement means comprises a counter coupled to said auxiliary oscillator to count the cycles thereof and activated for a preselected period to obtain said digital form signal.

10. An object detection system as claimed in claim 9 in which said processing means is coupled to the counter in each installation to control the activation period of same.

11. An object detection system as claimed in claim 10 in which said processing means is coupled to supply an activation signal for said preselected period to activate all the counters simultaneously.

12. An object detection system as claimed in claim 8 in which said processing means is coupled to all said installations to receive said digital form signals as parallel data over a common data bus, and said processing means is coupled to each installation to individually enable the transmission therefrom of the digital form frequency data to the processing means.

13. An object detection system as claimed in claim 7 in which each of said installations further comprises means for providing a measurement of the frequency or period of said auxiliary oscillator in digital form for supply to said processing means and in which said measurement means are coupled in parallel to said common data bus to apply said digital form signals thereto and the coupling between the processing means and each installation includes a plurality of control lines to select the transmission of programming data to an individual installation and the acquisition of frequency data from an individual installation.

14. An object detection system as claimed in claim 12 in which said processing means comprises a microprocessor or microcomputer device and said common data bus is connected to a bidirectional port of said device.

15. An object detection system as claimed in claim 13 in which said processing means comprises a microprocessor or microcomputer device and said common data bus is connected to a bidirectional port of said device.

16. An object detection system as claimed in claim 13 in which said control lines include a first coupling bus for supplying signals from the processing means to select individual installations for the reception or transmission of data, and a second coupling bus connecting all the installations in parallel to receive signals selecting the reception or transmission of data.

17. An object detection system as claimed in claim 16 in which a further control line is connected in parallel to all said installations from the processing means to supply a signal thereto for all the measurement means to simultaneously establish the frequency or period of the associated auxiliary oscillator.

* * * * *